United States Patent

Wakai

[15] 3,702,978

[45] Nov. 14, 1972

[54] ASTABLE MULTI-VIBRATOR

[72] Inventor: Shuzo Wakai, 1-2, Koaza Kubo, Oaza Shoryuji, Nagaokacho, Otokuni-gun, Kyoto, Japan

[22] Filed: May 17, 1971

[21] Appl. No.: 143,992

[30] Foreign Application Priority Data

May 20, 1970 Japan .......................45/43647

[52] U.S. Cl. ...............................331/113 R, 331/144
[51] Int. Cl. .............................................H03k 3/282
[58] Field of Search...............................331/113, 144

[56] References Cited

UNITED STATES PATENTS 3,249,893 5/1966 Castellano, Jr. .......331/113 R

*Primary Examiner*—John Kominski
*Attorney*—Stevens, Davis, Miller & Mosher

[57] ABSTRACT

An astable multi-vibrator employed in a vertical oscillator requiring a short duty cycle. It comprises two main transistors, one of which has the emitter connected to a resistor, which is in turn shunted by a resistance lower than its resistance during a period constituting the duty cycle, whereby the duty cycle may be reduced without increasing power consumption.

3 Claims, 5 Drawing Figures

S. WAKAI
INVENTOR

BY Stevens, Davis, Miller & Mosher
ATTORNEYS

ASTABLE MULTI-VIBRATOR

This invention relates to astable multi-vibrators having a short duty cycle and consuming very little power.

As is well known in the art, astable multi-vibrators have been extensively used in horizontal and vertical oscillators for television receiving sets.

Figure 1:
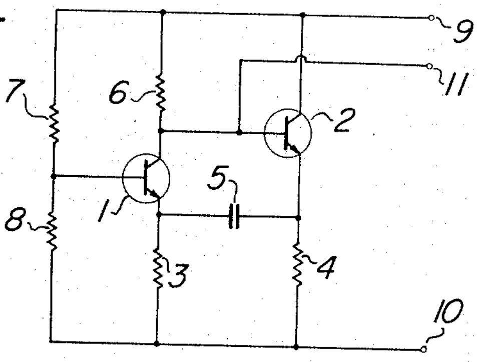
FIG. 1 PRIOR ART

FIG. 1 is a circuit diagram of a conventional multi-vibrator circuit.

Figures 2A, 2B, 2C:
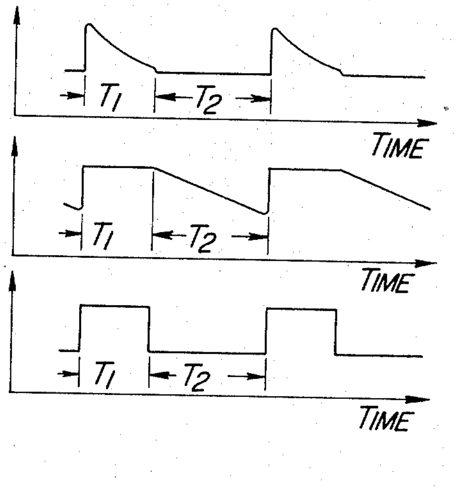
FIG. 2a PRIOR ART, FIG. 2b PRIOR ART, FIG. 2c PRIOR ART

FIGS. 2*a*, 2*b* and 2*c* show waveforms of emitter and collector voltages on the transistors in the circuit of FIG. 1.

Figure 3:
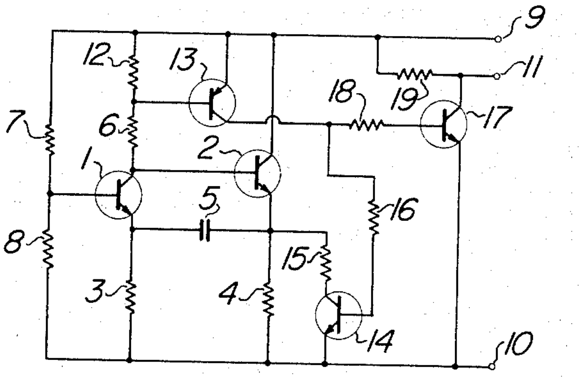

FIG. 3 is a circuit diagram of an embodiment of the astable multi-vibrator according to the invention.

Referring to FIG. 1, which shows a conventional multi-vibrator of the common-emitter capacitance-coupled type extensively employed in the horizontal and vertical oscillators for television receiving sets, in which reference numerals 1 and 2 designate transistors, numerals 3 and 4 resistors, numeral 5 a capacitor, the resistors 3 and 4 and the capacitor 5 determining the oscillation frequency, numeral 6 a resistor for biasing the collector of the transistor 2, numerals 7 and 8 resistors constituting a voltage divider to supply a base bias to the transistor 1, numerals 9 and 10 terminals connected across a biasing power supply, and terminal 11 an output terminal for deriving the oscillator output.

In the multi-vibrator circuit of the above construction, the frequency of the on-off oscillation of the transistors 1 and 2 is determined by the time constant for the circuit of the resistors 3 and 4 and the capacitor 5, the d-c voltage across the terminals 9 and 10 and the base bias voltages on the transistors 1 and 2, and the oscillator output is available at the output terminal 11.

FIGS. 2*a*, 2*b* and 2*c* show voltage waveforms on the transistors in the multi-vibrator circuit of the above construction. More particularly, FIG. 2*a* shows the waveform of the emitter voltage on the transistor 1, FIG. 2*b* shows the waveform of the emitter voltage on the transistor 2, and FIG. 2c shows the waveform of the collector voltage on the transistor 1.

As is apparent from these figures, the switching cycle of the transistors 1 and 2 is identical.

In this circuit, the period $T_1$, during which the transistor 1 is in the cut-off state and the transistor 2 is in the conduction state, depends upon the base bias voltage on the transistor 1, the resistance of the resistor 3 and the capacitance of the capacitor 5. On the other hand, the period $T_2$, during which the transistor 1 is in the conduction state and the transistor 2 is in the cut-off state, depends upon the base bias voltage on the transistor 1, the resistance of the resistor 4 and the capacitance of the capacitor 5. In other words, the ratio between the periods $T_1$ and $T_2$ depends upon the ratio between the resistances of the resistors 3 and 4.

If the astable multi-vibrator of the above construction is to be used, for instance, in a vertical oscillator for a television receiving set, the period $T_2$ is required to be quite short compared to the period $T_1$, that is, the duty cycle of the multi-vibrator should be short. Reducing the duty cycle, however, gives rise to increased power consumption.

Reducing the duty cycle means reducing the period $T_2$. To reduce the period $T_2$ necessitates that the resistance of the resistor 4 in the multi-vibrator circuit be sufficiently low.

As mentioned earlier, during the period $T_1$ (longer period) the transistor 1 is in the cut-off state and the transistor 2 is in the conduction state. Therefore, reducing the resistance of the resistor 4, which is connected to the emitter of the transistor 2, inevitably increases the emitter current in the transistor 2, and hence the power consumption. The shorter the duty cycle is made, the greater is the power consumption.

The increase of power consumption not only has disadvantages in itself, but also prevents various problems when integrating the multi-vibrator circuit into a semiconductor integrated circuit. For example, the configuration and heat radiating characteristic of the sealing vessel are subject to more severe requirements, and heat generated in a semiconductor integrated circuit may have adverse effects on the temperature performance thereof.

This invention is intended to improve the above-mentioned relation between the duty cycle and power consumption of the conventional multi-vibrator circuits, and it has an object of providing an astable multi-vibrator, which enables the obtaining of an oscillation waveform of an extremely short duty cycle which nevertheless requires extremely low power operation.

This invention will now be described in conjunction with one embodiment thereof with reference to FIG. 3.

Referring to the figure, a multi-vibrator circuit according to this invention adds to the conventional multi-vibrator circuit above-mentioned a resistor 12, transistors 13 and 14 and resistors 15 and 16. The resistor 12 serves to provide a base bias voltage on the transistor 13 when the transistor 1 is triggered. Upon triggering of the transistor 1, therefore, the transistor 13 is triggered, causing the collector current thereof to pass to the base of the transistor 14 to trigger the same. The resistor 15 serves to bypass the current through the resistor 4, which determines the period $T_2$, when the transistor 14 is triggered. The resistor 16 serves to restrict the base current into the transistor 14.

A transistor 17 and resistors 18 and 19 constitute an output circuit for deriving the oscillator output appearing at the output terminal 11.

With the astable multi-vibrator circuit of the construction described above according to the invention, an oscillation mode of a short duty cycle may be achieved with low power consumption.

In the operation of the circuit construction described above, at the start of the period $T_2$ the transistor 1 is triggered. The collector current from the transistor 1 produces a voltage on the connection point between the resistors 6 and 12, which is impressed on the base of the transistor 13, and a collector current of the transistor 13 is supplied through the resistor 16 to the base of the transistor 14 to trigger the same.

The resistance of the resistor 15 connected to the collector of the transistor 14 is made quite low in comparison to the resistance of the resistor 4. By so doing, when the transistor 14 is triggered, the resistor 4 connected to the emitter of the transistor 2 is shunted by the small resistance of the resistor 15. Thus, the period $T_2$ is practically determined by the time constant for the circuit of the capacitor 5 and resistor 15 and is extremely reduced.

During the period $T_1$, during which the transistor 1 is "off" and the transistor 2 is "on", the transistor 13 is held "off", since the transistor 1 carries no collector current. Thus, during this period the transistor 14 is also "off", so that the shunting effect of the resistor 15 is lost and the current carried by the transistor 2 depends upon the resistor 4 alone. If the resistance of the resistor 4 is increased, the current carried by the transistor 2 during the period $T_1$ may be reduced, while reducing the resistance of the resistor 15 reduces power consumption during the period $T_2$.

The oscillator output is taken out through the output circuit of transistor 17 and resistors 18 and 19, which is connected to the collector of the transistor 13, and it appears at the output terminal 11.

As has been described in the foregoing, according to this invention it is possible to provide an astable multi-vibrator which can afford an oscillation mode with an extremely short duty cycle and enables power consumption to be greatly reduced. Also, various problems arising in integrating the conventional multi-vibrator circuit into a semiconductor chip and the high power requirement stemming from that are entirely eliminated.

What is claimed is:

1. An astable multi-vibrator comprising a first transistor having the collector thereof connected through a resistor to one of a pair of power supply terminals and the emitter thereof connected through a resistor to the other one of said power supply terminals, a voltage divider connected between said power supply terminals and supplying a bias voltage to the base of said first transistor, a second transistor having the base thereof connected to the collector of said first transistor, the collector thereof connected through a resistor to said other one of said power supply terminals, a capacitor connected between the emitters of said first and second transistors, a third transistor having the base thereof biased with the collector current from said first transistor when said first transistor is in the conduction state, and a shunt circuit having a fourth transistor and a shunt resistor in series with said fourth transistor, said shunt circuit being connected in shunt with said resistor connected to the emitter of said second transistor, said fourth transistor having the base thereof biased with the collector current from said third transistor when said first, third and fourth transistors carry current, said shunt resistor having a resistance lower than that of said resistor connected to the emitter of said second transistor.

2. An astable multi-vibrator comprising first and second transistors each having first, second and third electrodes; a CR circuit consisting of a capacitor coupled between the first electrodes of said first and second transistors and first and second resistors coupled in series with the first electrodes of said first and second transistors respectively; and a shunt transistor having first and third electrodes coupled in parallel with said second resistor and a second electrode coupled to the third and second electrodes of said first and second transistor, said shunt transistor conducting only when said first transistor is conducting thereby shunting said second transistor.

3. An astable multi-vibrator as defined by claim 2 wherein a shunt resistor is coupled in series with the third electrode of said shunt transistor, said third resistor having a resistance lower than that of said second resistor.

* * * * *